(12) United States Patent
Tai

(10) Patent No.: US 6,400,627 B1
(45) Date of Patent: Jun. 4, 2002

(54) SENSING CIRCUIT FOR MAGNETIC MEMORY UNIT

(75) Inventor: Jy-Der David Tai, Phoenix, AZ (US)

(73) Assignee: AMIC Technology (Taiwan) Inc., Hsin-Chu Hsien (TW)

( * ) Notice: Subject to any disclaimer, the term of this patent is extended or adjusted under 35 U.S.C. 154(b) by 0 days.

(21) Appl. No.: 09/848,364

(22) Filed: May 4, 2001

(30) Foreign Application Priority Data

Dec. 29, 2000 (TW) .......................................... 089128203

(51) Int. Cl.[7] .................................................. G11C 7/00
(52) U.S. Cl. ........................................ 365/209; 365/210
(58) Field of Search ................................ 365/209, 210, 365/207, 203, 205

(56) References Cited

U.S. PATENT DOCUMENTS 6,185,143 B1 * 2/2001 Perner et al. ................ 365/209

* cited by examiner

Primary Examiner—Tan T. Nguyen
(74) Attorney, Agent, or Firm—Winston Hsu

(57) ABSTRACT

A magnetic memory unit includes at least one magnetic resistor, whose magnetized direction represent bit information stored in the magnetic memory unit, at least one read line, a current source for providing the magnetic resistor a bias current to produce an output voltage, and a sensing circuit for sensing the output voltage. The sensing circuit includes several components and has a symmetrical structure, so as to avoid defects while sensing the bit information stored in the magnetic memory unit.

11 Claims, 3 Drawing Sheets

SENSING CIRCUIT FOR MAGNETIC MEMORY UNIT

BACKGROUND OF THE INVENTION

1. Field of the Invention

The present invention relates to a sensing circuit for a magnetic memory unit, and more particularly, to a sensing circuit able to rapidly read bit information stored in the magnetic memory unit.

2. Description of the Prior Art

Please refer to FIG. 1. FIG. 1 is a circuit diagram of a magnetic memory unit 10 of the prior art. The magnetic memory unit 10 comprises a sensing circuit 20, a first switch 32, a current source 36 with a fixed value, at least one magnetic resistor 38, 138, 238, and 338, and at least one read line 39, 139, 239, and 339. The magnetic memory unit 10 corresponds to an address decoder 42 connected with the first switch 32 and the first switch is turned on if the magnetic memory unit 10 is chosen by the address decoder 42. The address decoder is also connected to the read line 39, 139, 239, and 339 for determining which switch is turned on or not. The current source 36 provides a bias current.

The sensing circuit comprises an inverter 22, a capacitor 28 and a second switch 34. The inverter 22 has an input 24 and an output 26. The capacitor 28 is connected electrically to the input 24 of the inverter 22, and to the current source 36. The second switch 34 is connected electrically to the input 24 and the output 26 of the inverter 22.

When the read line 39 is turned on, a magnetic field induced by a current passing through the read line 39 interacts with the magnetic resistor 38 having different resistance values, due to the two magnetized directions of the resistor.

A first voltage sum of the voltages while the current source 36 passes through the magnetic resistors 38, 138, 238, and 338, is outputted to the capacitor 28 if one of the read lines 39, 139, 239, 339 is turned on. At the same time, the second switch 34 is turned on setting the input 24 and the output 26 of the inverter 22 equal to a second voltage. This technique is referred to as zeroing. A voltage across the capacitor 28 is the difference between the first voltage and the second voltage.

When the second switch 34 is turned off there is a difference in the voltages outputted to the capacitor 28 caused also by the magnetized directions of the magnetic resistors being in different directions. Following this, the voltages of the input 24 of the inverter 22 vary with different voltages outputted to the capacitor 28, and the output end 26 of the inverter 22 responds to variations of different voltages to the input 24, and shows complementary outputs in comparison with the voltages of the input 24. By sensing the voltages of the output 26, it is not very difficult to achieve bit information storage for the magnetic memory unit 10.

Finally, the second switch is turned on for equalizing the voltages of the input 24 and the output 26 and in preparation for reading the next bit of information.

Please refer to FIG. 2. FIG. 2 is an input and output relationship diagram of the sensing circuit 20 of the magnetic memory unit 10. $V_{24}$ and $V_{26}$ represent the voltages of the input 24 and the output 26 of the inverter 22, respectively. When the second switch 34 of FIG. 1 is turned on, the value of voltage $V_{24}$ and voltage $V_{26}$ are equal. After sensing voltages of the output 26 of the inverter 22, the sensing circuit 20 of FIG. 1 undergoes zeroing to make sure the bit information sensed next time is accurate. But when the second switch 34 is turned on, a small amount of charge from the second switch 34 moves to the input end 24, resulting in a large variation of $V_{26}$ so that the voltage sensed by the sensing circuit 20 is not the true value of $V_{26}$.

SUMMARY OF THE INVENTION

It is therefore an objective of the present invention to provide a sensing circuit that has not only a high sensitivity, but also allows bit information stored in a magnetic memory unit to be sensed rapidly and accurately, using positive feedback for regenerating the bit information.

In accordance with the claimed invention, a magnetic memory unit includes at least one magnetic resistor and a sensing circuit with a first inverter and a second inverter electrically connected in a back-to-back fashion forming a latch, an enabler for enabling the first inverter and the second inverter, a first capacitor, a second capacitor, and an equalizer.

It is an advantage of the present invention that the present invention provides a sensing circuit with a symmetric structure, with this kind of sensing circuit able to achieve the same amount of charge injection occurring in an input end and an output end of the sensing circuit. This leads to a more accurate and rapid result.

These and other objectives of the present invention will no doubt become obvious to those of ordinary skill in the art after reading the following detailed description of the preferred embodiment that is illustrated in various figures and drawings.

DETAILED DESCRIPTION OF THE PREFERRED EMBODIMENT

Figure 1:
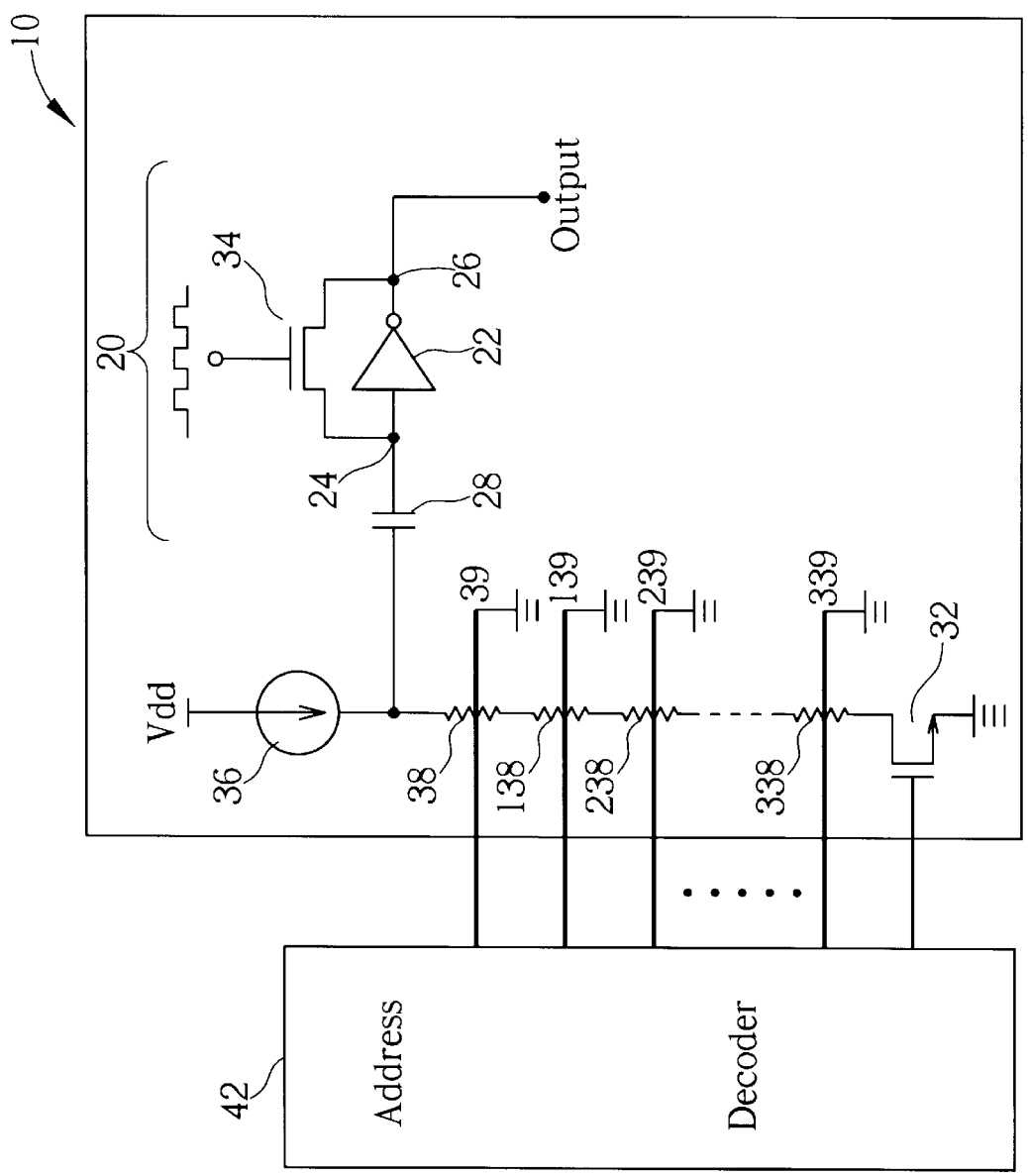
FIG. 1 is a circuit diagram of a sensing circuit for a magnetic memory unit according to the prior art.
Figure 2:
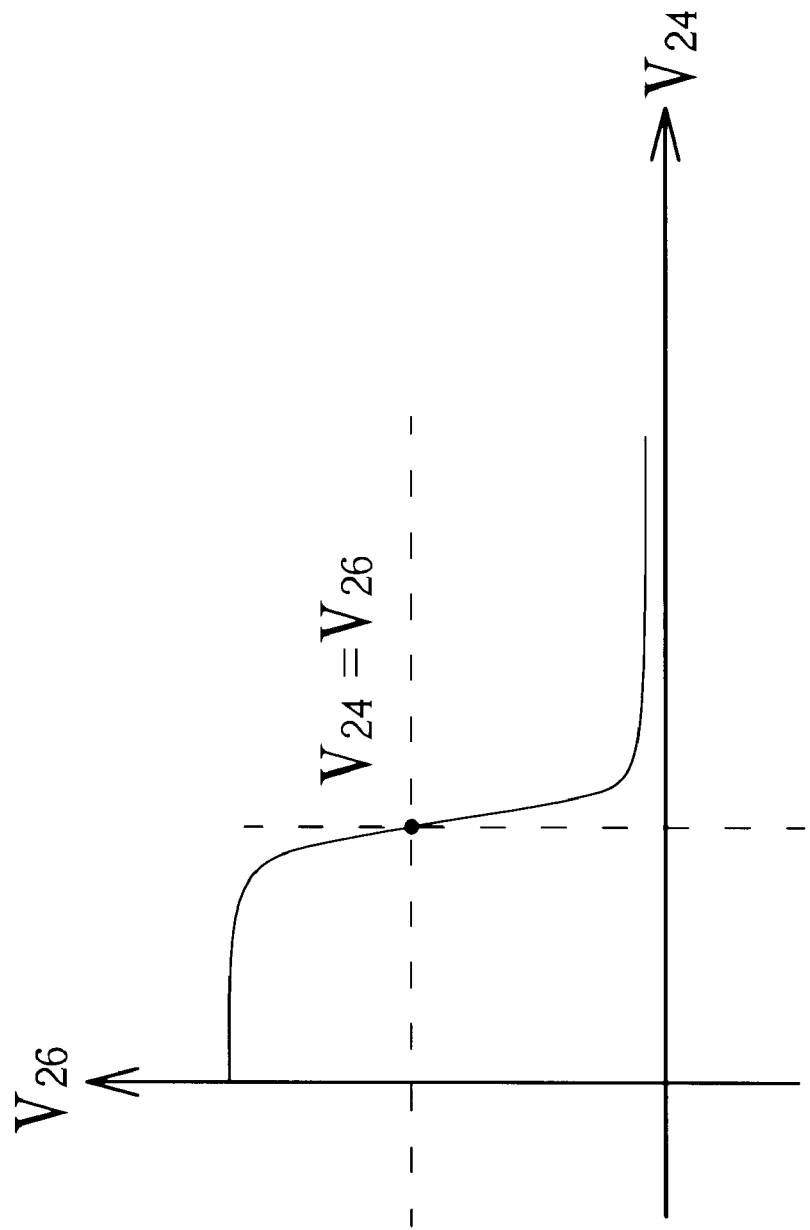
FIG. 2 is a relationship diagram between an input and an output of an inverter of the sensing circuit shown in FIG. 1.
Figure 3:
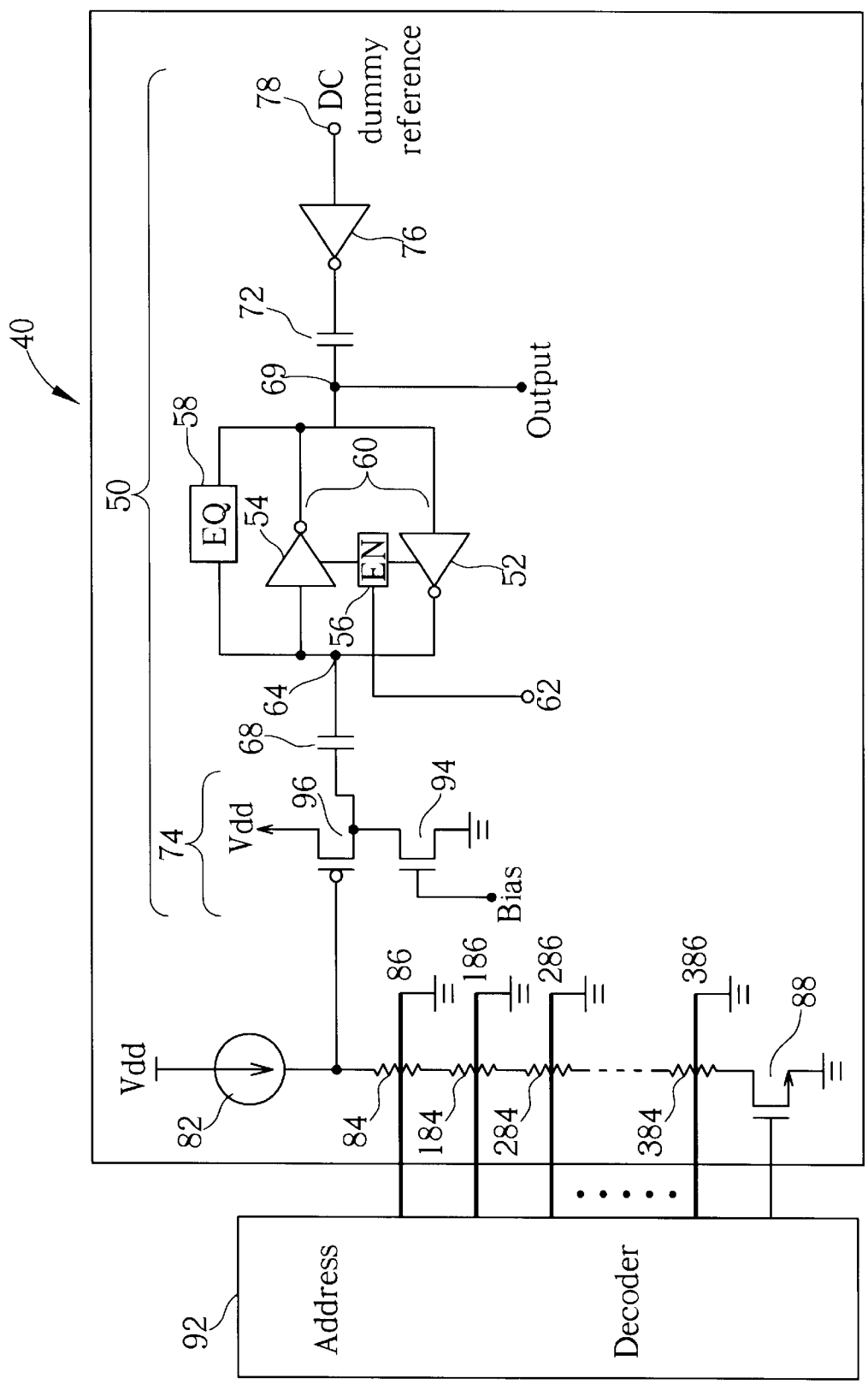
FIG. 3 is a circuit diagram of a magnetic memory unit according to the present invention.

Please refer to FIG. 3. FIG. 3 is a circuit diagram of a magnetic memory unit 40 of the present invention. The magnetic memory unit comprises a sensing circuit 50, a current source 82 with a fixed value, at least one magnetic resistor 84, 184, 284, and 384, at least one read line 86, 186, 286, and 386 and a switch 88. The magnetic memory unit 40 corresponds to an address decoder 92 electrically connected with the switch 88 and the read lines 86, 186, 286, and 386. The address decoder 92 is used to determine whether the switch 88 is turned on to select the magnetic memory unit 40, and whether the read lines 86, 186, 286, and 386 are turned on for reading bit information stored in the corresponding magnetic resistors 84, 184, 284, and 384. The current source 82 serves as a bias current.

The sensing circuit 50 comprises a first inverter 52, a second inverter 54, an enabler 56, an equalizer 58, a driving signal 62 to the enabler 56, an input 64, an output 69, a first capacitor 68, a second capacitor 72 with the same value as the first capacitor 68, a third inverter 74, a fourth inverter 76 as same as the third inverter 74, and a direct current (dc) dummy voltage 78.

The first inverter 52 and the second inverter 54 form a latch 60 in a back to back fashion. The enabler 56 is used to activate the first inverter 52 and the second inverter 54 for causing voltages of the input 64 and the output 69 to change in two opposite manners. The equalizer 58 is connected electrically with the input 64 and the output 69, and thus the voltage of the input end 64 and the voltage of the output end 69 are equal while the equalizer 58 is activated. One end of the third inverter 74 is connected with the first capacitor 68, while the other end of the third inverter 74 is connected with the magnetic resistor 84 for inputting a differential voltage, which relates to one of the magnetic resistances of the magnetic resistor 84 while one of their corresponding read lines 86, 186, 286, and 386 is turned on. The third inverter 74 is a low gain inverter and its main purpose is not to increase an amplifying rate of a signal but to maintain a good signal to noise ratio (SNR). The fourth inverter 76 is connected with the second capacitor 72 and the dc dummy voltage 78. The third inverter 74 is a combination of a NMOSFET 94 and a PMOSFET 96. A gate of the NMOSFET 94 is connected with a bias voltage, and a gate of the PMOSFET 96 is connected with the magnetic resistor 84 and the current source 82. A drain of the PMOSFET 96 is electrically connected with the first capacitor 68.

The current source 82 provides a bias current to the magnetic resistors 84, 184, 284, and 384. While one of the read lines 86, 186, 286, and 386 has a pre-reading signal, a first voltage is outputted to the third inverter 74 and the voltage of input 64 and the voltage of the output 69 are equal to a second voltage, since the equalizer 58 is on and the enabler 56 is off. A voltage across the first capacitor 68 equals the difference of the first voltage and the second voltage at this point. The equalizer 58 is then turned off to maintain the condition of the input 64 and the output 69 as when the equalizer 58 has not been turned off.

Thereafter, if the read lines 86, 186, 286, and 386 have a reading signal, a corresponding voltage is outputted to the third inverter 74 and causes a voltage change on the end, connected with the third inverter 74, of the capacitor 68, resulting in a same voltage change on the input end 64 of the latch 60. The enabler 56 is then activated, and the reading signal is amplified to allow the output 69 of the latch 60 to have a complementary output to the input 64 of the latch 60. This is due to signal regeneration. After that, the read lines 86, 186, 286, and 386 are turned off and the output 69 is the bit information stored in the magnetic memory unit 40. The voltage of the input end 64 and the output end 69 remain the same after reading the bit information stored in the magnetic memory unit 40, and the enabler 56 is turned off and the equalizer 58 is turned on.

From a circuit design standpoint, the capacitances of the first capacitor 68 and the second capacitor 72 are effectively the same, and thus the operating characteristic of the third inverter 74 and the fourth inverter 76 are effectively the same also. A value of the dc dummy voltage 78 is equal to a sum of voltages of the magnetic resistors 84, 184, 284, and 384 if none of the read lines 84, 184, 284, and 384 are turned on. The symmetric structure of the circuit design is to assure the input end 64 and the output end 69 have the same amount of charge injection and so thereby ensure the accuracy of the sensing circuit 50.

In comparison with the prior art, the present invention uses the advantage of symmetry in circuit design and the fact that the voltage of the input end and that of the output end can be equalized. As a result, the bit information stored in the magnetic memory unit can be sensed rapidly and detected accurately regardless of occurrences of charge injection.

What is claimed is:

1. A magnetic memory unit comprising:
   at least one magnetic resistor, a magnetized direction of the magnetic resistor representing bit information stored in the magnetic memory unit;
   at least one read line;
   a current source for providing the magnetic resistor a bias current to produce an output voltage; and
   a sensing circuit for sensing the output voltage, the sensing circuit comprising:
      a first inverter and a second inverter electrically connected in a back-to-back fashion forming a latch;
      an enabler for enabling the first inverter and the second inverter, causing a voltage of an input end and an output end to change in two opposite manners;
      a first capacitor and a second capacitor; and
      an equalizer electrically connected with the input end and the output end for equalizing voltages of the input end and the output end;
   wherein when the enabler is off, the equalizer is on, and the read line is on for pre-reading, the voltages of the input end and the output end are the same, and when the enabler is turned on, the equalizer is turned off, the read line is on, and the voltages of the input end and the output end are changed to two opposite voltages enabling sensing and recording of the bit information stored in the magnetic memory unit.

2. The magnetic memory unit of claim 1 wherein the sensing circuit further comprises a third inverter electrically connected to the magnetic resistor and the first capacitor.

3. The magnetic memory unit of claim 2 wherein the third inverter comprises an NMOS FET and a PMOS FET.

4. The magnetic memory unit of claim 3 wherein a gate of the PMOS FET is electrically connected to the magnetic resistor, a source of the PMOS FET is connected to the first capacitor, and a gate of the NMOS FET is connected to a bias voltage.

5. The magnetic memory unit of claim 2 wherein the third inverter is a low gain inverter to improve a signal-to-noise ratio of the magnetic memory unit.

6. The magnetic memory unit of claim 2 wherein a bias voltage of the third inverter is provided by a voltage of the magnetic resistor when the current source provides the bias current.

7. The magnetic memory unit of claim 1 wherein the read line is a word line.

8. The magnetic memory unit of claim 1 wherein the sensing circuit further comprises a fourth inverter and a direct current (DC) dummy voltage.

9. The magnetic memory unit of claim 8 wherein the second capacitor is electrically connected to the fourth inverter.

10. The magnetic memory unit of claim 8 wherein a capacitance of the first capacitor is effectively equal to a capacitance of the second capacitor, operating characteristics of the third inverter are effectively the same as operating characteristics of the fourth inverter, and the DC dummy voltage is equal to a sum of voltages of the at least one magnetic resistor when the read line is off and only the current source provides current through the at least one magnetic resistor.

11. The magnetic memory unit of claim 1 further comprising a corresponding address decoder for determining if the read line is on or off.

* * * * *